United States Patent
Tsuchiko

(10) Patent No.: US 10,319,848 B2
(45) Date of Patent: *Jun. 11, 2019

(54) VERTICAL DMOS TRANSISTOR

(71) Applicant: Alpha and Omega Semiconductor Incorporated, Sunnyvale, CA (US)

(72) Inventor: Hideaki Tsuchiko, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/017,686

(22) Filed: Jun. 25, 2018

(65) Prior Publication Data

US 2018/0308969 A1    Oct. 25, 2018

Related U.S. Application Data

(63) Continuation of application No. 15/632,199, filed on Jun. 23, 2017, now Pat. No. 10,032,900, which is a
(Continued)

(51) Int. Cl.
*H01L 29/78* (2006.01)
*H01L 29/40* (2006.01)
(Continued)

(52) U.S. Cl.
CPC ........ *H01L 29/7802* (2013.01); *H01L 21/265* (2013.01); *H01L 21/30604* (2013.01);
(Continued)

(58) Field of Classification Search
CPC ..... H01L 29/78; H01L 29/7802; H01L 29/66; H01L 29/417; H01L 29/08; H01L 29/66712; H01L 29/41741; H01L 29/0878; H01L 29/0653; H01L 29/40; H01L 29/088; H01L 29/06; H01L 29/407;
(Continued)

(56) References Cited

U.S. PATENT DOCUMENTS 7,183,193 B2   2/2007  Husher
7,411,266 B2   8/2008  Tu et al.
(Continued)

OTHER PUBLICATIONS

Sherman et al., "Advancing Silicon Performance Beyond the Capabilities of Discrete Power MOSFETS", Bodo's Power Systems, Electronics in Motion and Conversion, Jul. 2010, pp. 22-25.

*Primary Examiner* — Chuong A Luu
(74) *Attorney, Agent, or Firm* — Innovation Counsel LLP

(57) ABSTRACT

A transistor includes a semiconductor body; a first gate electrode formed on a first portion of the semiconductor body and a second gate electrode formed on a second portion of the semiconductor body. A drain region is formed on a first side of the first gate electrode and a first source region is formed on a second side of the first gate electrode. The drain region is formed on a first side of the second gate electrode and a second source region is formed on a second side of the second gate electrode. A trench is formed in the semiconductor body and positioned in the drain region. A doped sidewall region is formed in the semiconductor body along the sidewall of the trench outside of the trench. The doped sidewall region is in electrical contact with the drain region and forms a vertical drain current path for the transistor.

20 Claims, 6 Drawing Sheets

Related U.S. Application Data continuation of application No. 15/013,812, filed on Feb. 2, 2016, now Pat. No. 9,722,069, which is a continuation of application No. 14/627,959, filed on Feb. 20, 2015, now Pat. No. 9,287,384, which is a continuation of application No. 13/720,069, filed on Dec. 19, 2012, now Pat. No. 9,006,820.

(51) Int. Cl.

| | | |
|---|---|---|
| *H01L 29/417* | (2006.01) | |
| *H01L 29/66* | (2006.01) | |
| *H01L 29/08* | (2006.01) | |
| *H01L 21/8234* | (2006.01) | |
| *H01L 27/088* | (2006.01) | |
| *H01L 21/265* | (2006.01) | |
| *H01L 21/306* | (2006.01) | |
| *H01L 27/092* | (2006.01) | |
| *H01L 29/06* | (2006.01) | |

(52) U.S. Cl.
CPC ........ *H01L 21/823418* (2013.01); *H01L 21/823493* (2013.01); *H01L 27/088* (2013.01); *H01L 27/0922* (2013.01); *H01L 27/0928* (2013.01); *H01L 29/0847* (2013.01); *H01L 29/0878* (2013.01); *H01L 29/407* (2013.01); *H01L 29/41741* (2013.01); *H01L 29/41766* (2013.01); *H01L 29/66659* (2013.01); *H01L 29/66712* (2013.01); *H01L 29/66719* (2013.01); *H01L 29/7809* (2013.01); *H01L 29/7835* (2013.01); *H01L 29/0653* (2013.01); *H01L 29/086* (2013.01)

(58) Field of Classification Search
CPC ......... H01L 29/41766; H01L 29/66659; H01L 29/66719; H01L 29/7835; H01L 27/092; H01L 27/0922; H01L 27/0928; H01L 29/7809
USPC ........................................................ 257/328
See application file for complete search history.

(56) References Cited

U.S. PATENT DOCUMENTS

| | | |
|---|---|---|
| 7,566,931 B2 | 7/2009 | Kocon |
| 7,576,391 B2 | 8/2009 | Williams et al. |
| 7,868,379 B2 | 1/2011 | Loechelt |
| 7,923,774 B2 | 4/2011 | Bhalla et al. |
| 7,989,857 B2 | 8/2011 | Loechelt |
| 8,004,039 B2 | 8/2011 | Zinn |
| 8,198,454 B2 | 6/2012 | Nakamura et al. |
| 8,227,860 B2 | 7/2012 | Alter et al. |
| 9,722,069 B2 | 8/2017 | Tsuchiko |
| 10,032,900 B2 * | 7/2018 | Tsuchiko ........ H01L 21/823418 |
| 2005/0112822 A1 | 5/2005 | Litwin |
| 2009/0096021 A1 | 4/2009 | Loechelt et al. |
| 2009/0302378 A1 | 12/2009 | Husher |
| 2010/0006913 A1 | 1/2010 | Lin et al. |
| 2011/0006361 A1 | 1/2011 | Darwish |
| 2012/0018803 A1 | 1/2012 | Grebs et al. |
| 2012/0068231 A1 | 3/2012 | Garnett |
| 2013/0153987 A1 | 6/2013 | Venkatraman et al. |

\* cited by examiner

VERTICAL DMOS TRANSISTOR

CROSS REFERENCE TO OTHER APPLICATIONS

This application is a continuation of co-pending U.S. patent application Ser. No. 15/632,199, entitled VERTICAL DMOS TRANSISTOR, filed Jun. 23, 2017, now U.S. Pat. No. 10,032,900, issued Jul. 24, 2018, which is a continuation of U.S. patent application Ser. No. 15/013,812, entitled VERTICAL DMOS TRANSISTOR, filed Feb. 2, 2016, now U.S. Pat. No. 9,722,069, issued Aug. 1, 2017, which is a continuation of U.S. patent application Ser. No. 14/627,959, entitled VERTICAL DMOS TRANSISTOR, filed Feb. 20, 2015, now U.S. Pat. No. 9,287,384, issued Mar. 15, 2016, which is a continuation of U.S. patent application Ser. No. 13/720,069, entitled VERTICAL DMOS TRANSISTOR, filed Dec. 19, 2012, now U.S. Pat. No. 9,006,820, issued Apr. 14, 2015, which patents and patent applications are incorporated herein by reference for all purposes.

BACKGROUND OF THE INVENTION

The invention relates to semiconductor devices and, in particular, to a vertical DMOS Transistor.

Lateral double-diffused metal-oxide-semiconductor (LDMOS) transistors are commonly used in high-voltage applications (less than 10V to >1000 volts) because of their high breakdown voltage characteristics and compatibility with CMOS technology for low voltage devices. FIG. 1 is a cross-sectional view of a conventional low-side N-type LDMOS transistor. It is well known that by increasing the length of the drift region, denoted by the distance "d", the breakdown voltage of the LDMOS transistor can be accordingly increased.

FIG. 2 is a cross-sectional view of a conventional trench MOSFET device. In a trench MOSFET device, the gate electrode is formed in a trench and the channel is formed in a vertical region along the sidewall of the trench. The trench MOSFET device is thus a vertical transistor device with the source region on the top side and the drain terminal on the back side of the device. U.S. Pat. No. 7,576,391, to Williams et al., also describes a lateral trench MOSFET device with a trench gate to control channel current vertically down the side of an etched trench.

BRIEF DESCRIPTION OF THE DRAWINGS

Various embodiments of the invention are disclosed in the following detailed description and the accompanying drawings.

DETAILED DESCRIPTION

Figure 1:
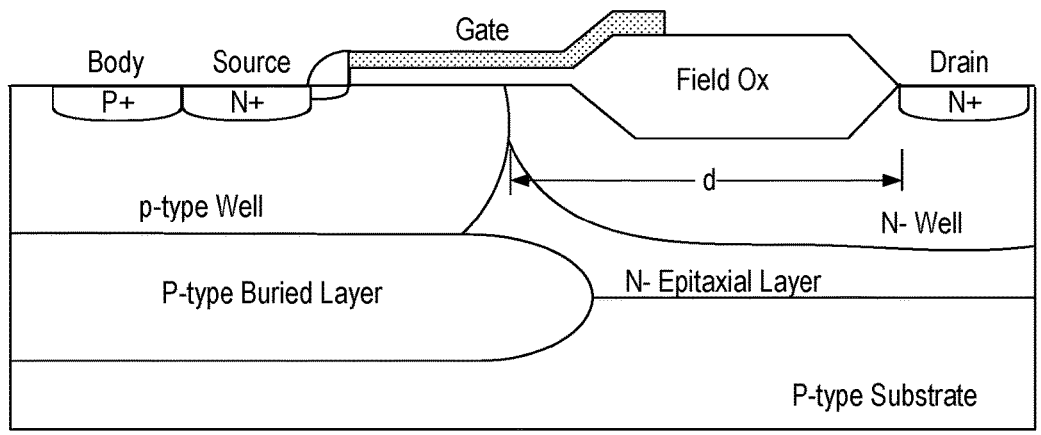
FIG. 1 is a cross-sectional view of a conventional low side N-type LDMOS transistor.
Figure 2:
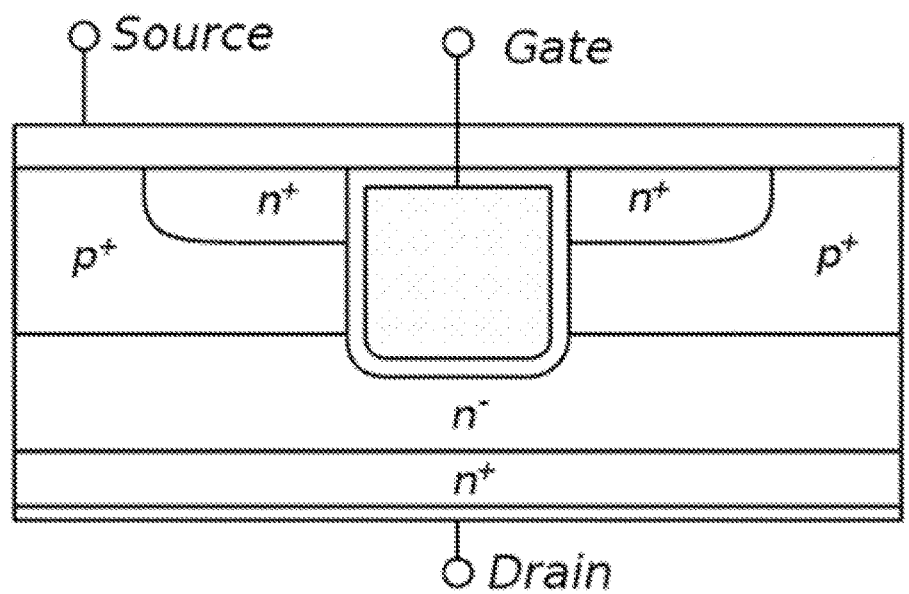
FIG. 2 is a cross-sectional view of a conventional trench MOSFET device.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In accordance with the principles of the present invention, a quasi-vertical double-diffused MOS (DMOS) transistor includes a vertical drain current path along the sidewall of a trench. The trench can incorporate a conductive field plate or be configured as a trench drain electrode. In some embodiment, the vertical drain current path is connected to a buried doped region which directs the drain current horizontally to a trench drain electrode forming a top side drain electrode. With a top-side drain electrode, the quasi-vertical DMOS transistor can be integrated as part of an integrated circuit. The quasi-vertical DMOS transistor can also be formed as a discrete device with a back-side drain electrode.

According to another aspect of the present invention, an NMOS transistor is formed with a drain extension in a vertical drain current path along the sidewall of a trench. The drain extension has the effect of lowering the drain voltage at the edge of the gate electrode so that the low voltage NMOS transistor can turn on or off the high voltage applied to the drain node without compromising device reliability.

In embodiments of the present invention, the quasi-vertical DMOS transistor includes a lateral channel formed in a semiconductor body under a gate electrode and insulated from the gate electrode by a gate dielectric layer. A trench is formed at the drain side of the gate electrode where a lightly doped sidewall region is formed to provide a high resistivity drain extension path along the sidewall of the trench. The drain current flowing from the lateral channel is caused to bend at the trench sidewall and the drain current flows along the lightly doped sidewall region, forming the vertical drain current path. In this manner, an extended drain drift region is formed in the vertical drain current path to increase the breakdown voltage of the quasi-vertical DMOS transistor.

In some embodiments, the vertical current path is connected to a buried doped region, such as a buried layer, which directs the drain current horizontally to a trench drain electrode. The trench drain electrode is formed as a conductor-filled trench and may be provided at each quasi-vertical DMOS transistor structure or a predetermined intervals for an array of parallelly connected quasi-vertical DMOS transistor structures.

The quasi-vertical DMOS transistor structure realizes many advantages over conventional lateral or vertical DMOS transistor devices. First, the quasi-vertical DMOS transistor of the present invention is constructed with a deep junction to breakdown at the bottom of the trench, not at the gate edge. The drain edge of the gate electrode therefore does not experience excessively high voltages. High electric field is seen at the bottom of P-well body. In this manner, hot carrier injection is improved. Accordingly, the ruggedness and reliability of the transistor device is improved and the transistor device can have a wide safe operating area. In addition, the depth of the trench and the doping level of the sidewall drain extension can be adjusted to optimize the highest voltage that can be applied to the drain node and the drain-to-source ON resistance, RdsON, without increasing the device pitch significantly. For example, a deeper trench and a more lightly doped sidewall region can increase the break down voltage of the drain node. Meanwhile, the RdsON*Area of the quasi-vertical DMOS transistor is smaller than that of the conventional lateral DMOS or LDMOS transistor. Furthermore, the quasi-vertical DMOS transistor can be integrated or formed as a discrete device. For instance, the quasi-vertical DMOS transistor can be integrated in a power integrated circuit to function as an on-chip power FET. In that case, a top-side trench drain electrode can be used to connect to a buried layer connecting to the vertical drain current paths for an array of parallelly connected transistors. Alternately, the quasi-vertical DMOS transistor can be formed as a discrete device and can be formed as an N-type or P-type device. For an N-channel DMOS transistor, the discrete device can be formed on an N+ substrate with an N-type epitaxial layer.

Figure 3:
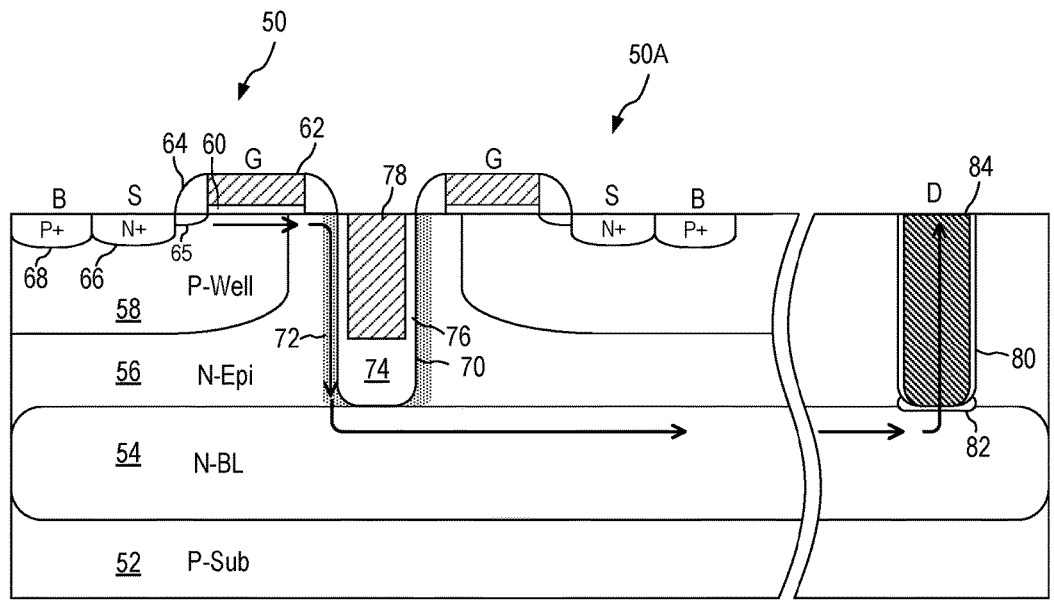
FIG. 3 is a cross-sectional view of a quasi-vertical DMOS transistor device incorporating a trench conductive field plate according to one embodiment of the present invention.

FIG. 3 is a cross-sectional view of a quasi-vertical DMOS transistor device incorporating a trench conductive field plate according to one embodiment of the present invention. Referring to FIG. 3, a quasi-vertical DMOS (qVDMOS) transistor 50 is formed on a P-type substrate 52 with an N-type buried layer (N-BL) 54 formed thereon as a buried doped region. An epitaxial layer 56 is formed on the P-substrate 52. The epitaxial layer 56 can be an N-type epitaxial layer or an P-type epitaxial layer. When a P-type epitaxial layer is used, the epitaxial layer may be converted to a light-doped N-type region by ion implantation or diffusion and annealing. A P-well 58 forming the body region of the qVDMOS transistor is formed in the epitaxial layer 56, such as by ion implantation. The P-well body 58 is then annealed. A gate dielectric layer 60 is then formed over the epitaxial layer 56 and a gate electrode 62 is formed over the gate dielectric layer. The gate electrode 62 partially overlaps the P-well body 58 and extends beyond it. After a lightly doped diffusion (LDD) region 65 is formed self-aligned to the gate electrode 62, sidewall spacers 64 are formed on the sides of the gate electrode. A heavily doped N+ source region 66 and a heavily doped P+ body contact region 68 are formed on the source side of the qVDMOS transistor 50. The N+ source region 66 and the P+ body contact region 68 are typically electrically shorted together in most applications.

Subsequently, a trench 70 is formed at the drain side of the qVDMOS transistor 50. The trench 70 is lined with a thin sidewall oxide 76 which can be deposited or thermally grown. N-type implantation, including sidewall angled implantation, is performed into trench 70 to form an N-type doped sidewall region 72 in the N-Epi layer 56 as well as an N-type doped region at the bottom of the trench. In embodiments of the present invention, the N-type doped sidewall region 72 is a lightly doped sidewall region. In one embodiment, the doped sidewall region 72 has a doping concentration lighter than the doping level of the P-well body 58. In some embodiments, the doped sidewall region 72 has a doping concentration in the range of $10^{15}/cm^3$ to $10^{17}/cm^3$. In one embodiment, the doped sidewall region 72 has a doping concentration in the order of $10^{16}/cm^3$.

The trench 70 is then filled with a thick oxide layer 74 at the bottom of the trench. The thickness of the thick oxide layer 74 is selected to increase the breakdown voltage while reducing the gate to drain capacitance. In the present embodiment, the trench 70 is then filled with a polysilicon layer 78. Polysilicon layer 78 functions as a trench conductive field plate, as will be described in more detail below. As thus configured, the lightly doped sidewall region 72 forms a drain extension region or drain drift region to increase the breakdown voltage of the qVDMOS transistor.

In alternate embodiments of the present invention, the trench 70 and subsequent implantation and deposition can be performed prior to the formation of the polysilicon gate electrode.

In embodiments of the present invention, the basic qVDMOS transistor structure 50 can be replicated to form an array of parallelly connected qVDMOS transistors to increase the current carrying capacity of the resulting transistor device. In FIG. 3, a mirror image 50A of the qVDMOS transistor structure 50 is formed on the other side of the trench 70. The same basic qVDMOS transistor structure 50/50A can be replicated to form an array of parallelly connected qVDMOS transistors with each pair of transistors sharing a common trench.

In the present embodiment, the lightly doped sidewall region 72 formed along the sidewall of trench 70 is electrically connected to the buried layer 54. Accordingly, buried layer 54 electrically connects the vertical drain current paths of all of the qVDMOS transistors thus formed in the N-Epi layer 56. In one embodiment, a top-side drain electrode is provided using a trench drain electrode 84 connecting to the buried layer 54, such as at a location away from the array of qVDMOS transistors. As shown in FIG. 3, the trench drain electrode 84 is formed by a trench 80 lined with a sidewall insulating layer, such as a sidewall oxide layer, and filled with a conductive layer, such as tungsten or aluminum. Typically, a doped region 82, such as formed by ion implantation, is formed at the bottom of the trench 80 to enhance the ohmic contact between the conductive layer in the trench and the buried layer 54.

In the present embodiment, the trench 70 of the qVDMOS transistor 50 is filled with a polysilicon layer 78 to form a trench polysilicon field plate as the trench conductive field plate. In embodiments of the present invention, the trench polysilicon field plate 78 is electrically connected to either the gate electrode or the source electrode of the qVDMOS transistor. The electrical connection can be accomplished through different means, such as through a metal interconnect or a polysilicon interconnect.

Connecting the trench conductive field plate to the gate electrode realizes a particular advantage of lowering the drain-source-On-resistance $R_{dsON}$ of the qVDMOS transistor. More specifically, when the qVDMOS transistor 50 is turned on, the gate voltage is at a logical high level (e.g. 5V) while the drain voltage is at a low level (e.g. near 0V). When the trench polysilicon layer 78 is connected to the gate electrode, the trench polysilicon layer 78 is also biased to a logical high level (e.g. 5V). When thus biased, the sidewall doped region 72 accumulates electrons and the resistance of the drain extension region is thereby reduced. Accordingly, by connecting the trench conductive field plate to the gate potential, the On-resistance $R_{dsON}$ of the qVDMOS transistor is reduced.

When the trench conductive field plate is electrically connected to the gate electrode, the gate-to-drain overlap capacitance increases. The increased capacitance may increase the switching speed of the qVDMOS transistor when applied in high speed switching applications. However, when the qVDMOS transistor is applied in low speed switching applications, such as below 2 MHz, the increased gate-to-drain overlap capacitance is not significant.

In application where high switching speed is desired and a higher $R_{dsON}$ On-resistance can be tolerated, the trench conductive field plate can be electrically connected to the source terminal. When the field plate is electrically connected to the source terminal, the sidewall doped region is not in accumulation mode. The On-resistance $R_{dsON}$ is not reduced, however the gate-to-drain overlap capacitance is minimized and the qVDMOS transistor thus formed can be operated at a high switching speed.

In the qVDMOS transistor of FIG. 3, the vertical drain current path of each transistor cell is connected to the N-buried layer 54 which carries the drain current horizontally to the drain electrode 84. In embodiments of the present invention, the resistivity of the drain extension path can be adjusted by varying the doping level of the N-buried layer 54 and varying the placement of the trench drain electrode 84. For example, based on the doping level, and thus the resistance, of the N-buried layer 54, a trench drain electrode 84 can be included for a given number of qVDMOS transistors. The number or spacing of the trench drain electrode 84 can be increased or decreased depending on the resistance of the N-buried layer 54 and the On-resistance $R_{dsON}$ of the device array in parallel.

Figure 4:
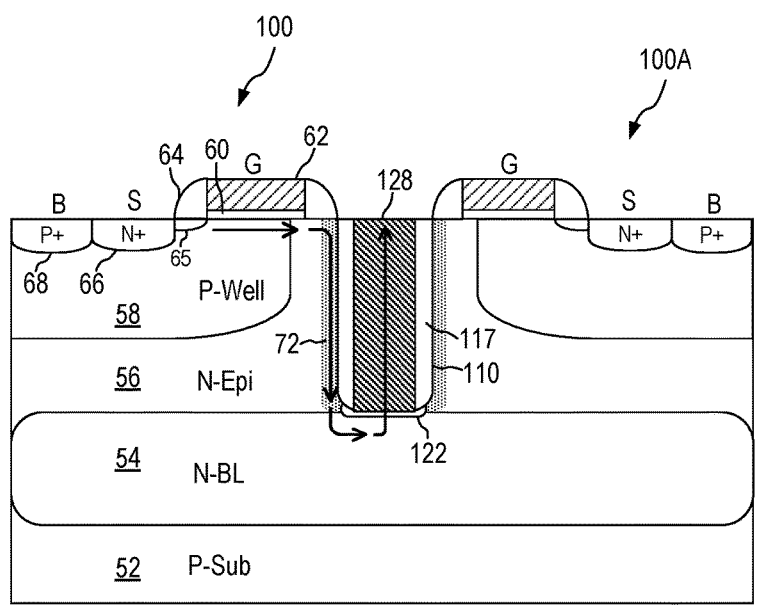
FIG. 4 is a cross-sectional view of a quasi-vertical DMOS transistor device incorporating a trench drain electrode according to one embodiment of the present invention.

FIG. 4 is a cross-sectional view of a quasi-vertical DMOS transistor device incorporating a trench drain electrode according to one embodiment of the present invention. Referring to FIG. 4, a qVDMOS transistor 100 is constructed in the same manner as qVDMOS transistor 50 of FIG. 3 with a vertical drain current path formed in an N-type lightly doped sidewall region 72 of a trench 110. However, in qVDMOS transistor 100, instead of forming a conductive field plate in the trench 110, the trench 110 is used to form a trench drain electrode 128. In this manner, qVDMOS transistor 100 is formed with a drain electrode at each transistor structure.

More specifically, after the trench 110 is formed, ion implantation is performed to form a doped region 122 at the bottom of the trench 110. The doped region 122 reduces the contact resistance between the buried layer 54 and the drain conductive layer subsequently formed, and forms an ohmic contact therebetween. The trench 110 is then lined with a sidewall oxide layer 117. The sidewall oxide layer 117 is thicker than the sidewall oxide layer 76 used for a conductive field plate. The sidewall oxide layer 117 has to be thick enough to electrically isolate the drain electrode from the drain extension region formed in the sidewall doped region 72. The trench 110 is then filled with a conductive material, such as aluminum or tungsten to form a trench drain electrode 128.

The basic qVDMOS transistor structure 100 can be mirrored to form a qVDMOS transistor 100A sharing the same trench drain electrode 128. The qVDMOS transistor structure 100/100A can be repeated to form an array of VDMOS transistors where a drain electrode is provided for each section or each strip of qVDMOS transistors.

As thus configured, the drain current flows through the vertical drain current path in the lightly doped sidewall region 72 to the N-buried layer 54 and then the drain current is picked up by the trench drain electrode 128. The resistance in the drain current path due to the N-buried layer 54 is reduced as the drain current is picked up very close to the vertical drain current path.

In the embodiments shown in FIGS. 3 and 4, the qVDMOS transistors are formed on an N-type buried layer. The N-buried layer is used to carry the drain current laterally from the vertical drain current path. In embodiments of the present invention, the N-type buried layer is formed as a sea of N-buried layer. When a conductive field plate is formed in the trench of the transistor structure, trench drain electrodes are formed at periodic intervals to pick up the drain current, as shown in FIG. 3. Alternately, the trench of the transistor structure can be used to form the trench drain electrode so that a drain electrode is provided for every pair of qVDMOS transistors, as shown in FIG. 4. In other embodiments, the qVDMOS transistor of FIG. 4 can be formed without the buried layer as the drain current is picked up at every pair of transistors. The qVDMOS transistor structures with a buried layer shown in FIGS. 3 and 4 have particular applications as a high-side switching device in a buck converter while a qVDMOS transistor structure without a buried layer can be used as a low-side switching device, as will be described in more detail below.

Figure 5:
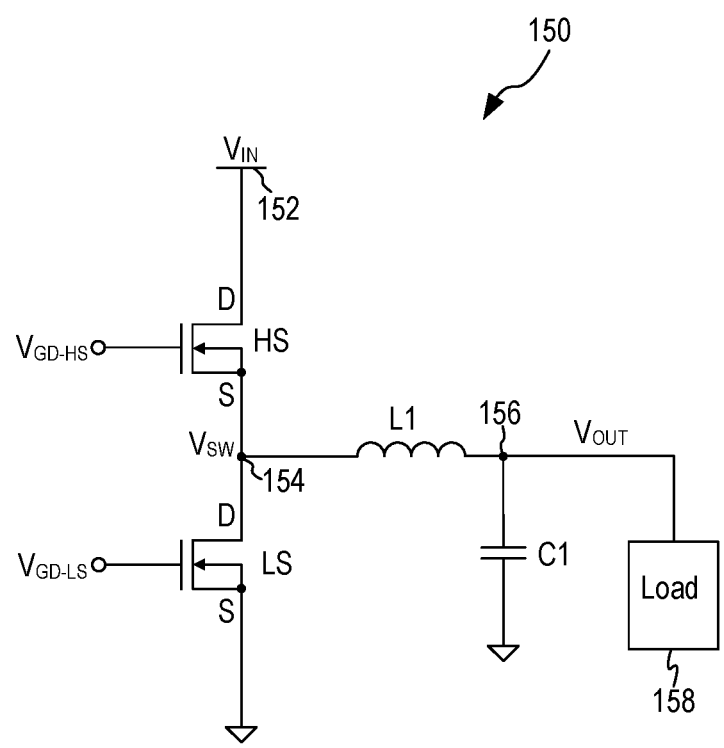
FIG. 5 is a circuit diagram of a switching circuit in a synchronous buck converter.

FIG. 5 is a circuit diagram of a switching circuit in a synchronous buck converter. Referring to FIG. 5, a synchronous buck converter 150 includes two power MOSFETs as the switching devices—one as the high side (HS) switching device and one as the low side (LS) switching device. The high side (HS) transistor and the low side (LS) transistor are alternately turned on and off to conduct current through inductor L1 to supply an output voltage $V_{OUT}$ at an output node 156. Inductor L1 and capacitor C1 forms a LC network to filter the output voltage $V_{OUT}$ to generate an output voltage with a substantially constant magnitude. The output voltage $V_{OUT}$ is used to drive a load 158. In the case of the switching circuit is implemented for a non-synchronous buck converter, the switching circuit may include only the high side transistor and a diode may be used for the low side.

In the synchronous buck converter 150, the high side transistor and the low side transistor are connected in series between an input voltage $V_{IN}$ (node 152) and ground. The common node 154 between the high side transistor and the low side transistor is a switching voltage $V_{SW}$ which can swing from ground and the input voltage $V_{IN}$. For instance, when the input voltage $V_{IN}$ is 16V, the switching voltage $V_{SW}$ can swing from 0V to 16V. The low side transistor has its drain terminal connected to the switching voltage and the source and body terminals connected to ground. Thus, the drain node of the low side transistor swings from ground and the input voltage $V_{IN}$. Meanwhile, the high side transistor has its drain terminal connected to the input voltage $V_{IN}$ while the source and body terminals are connected to the switching voltage $V_{SW}$. Thus, the source and body of the high side transistor have a voltage swing from ground and the input voltage $V_{IN}$.

For the low side transistor, the body of the transistor is merged with the P-substrate. For the high side transistor, the body of the transistor needs to be isolated from the P-substrate by an N-buried layer.

In embodiments of the present invention, a quasi VDMOS transistor is formed without an N-buried layer so that the quasi VDMOS transistor can be used as the low side transistor in a buck converter. Furthermore, in embodiments of the present invention, a quasi VDMOS transistor formed on a buried layer and a quasi VDMOS formed without any buried layer are formed on the same integrated circuit to allow the integrated circuit to be used as the power switching transistors of a buck converter.

Figure 6:
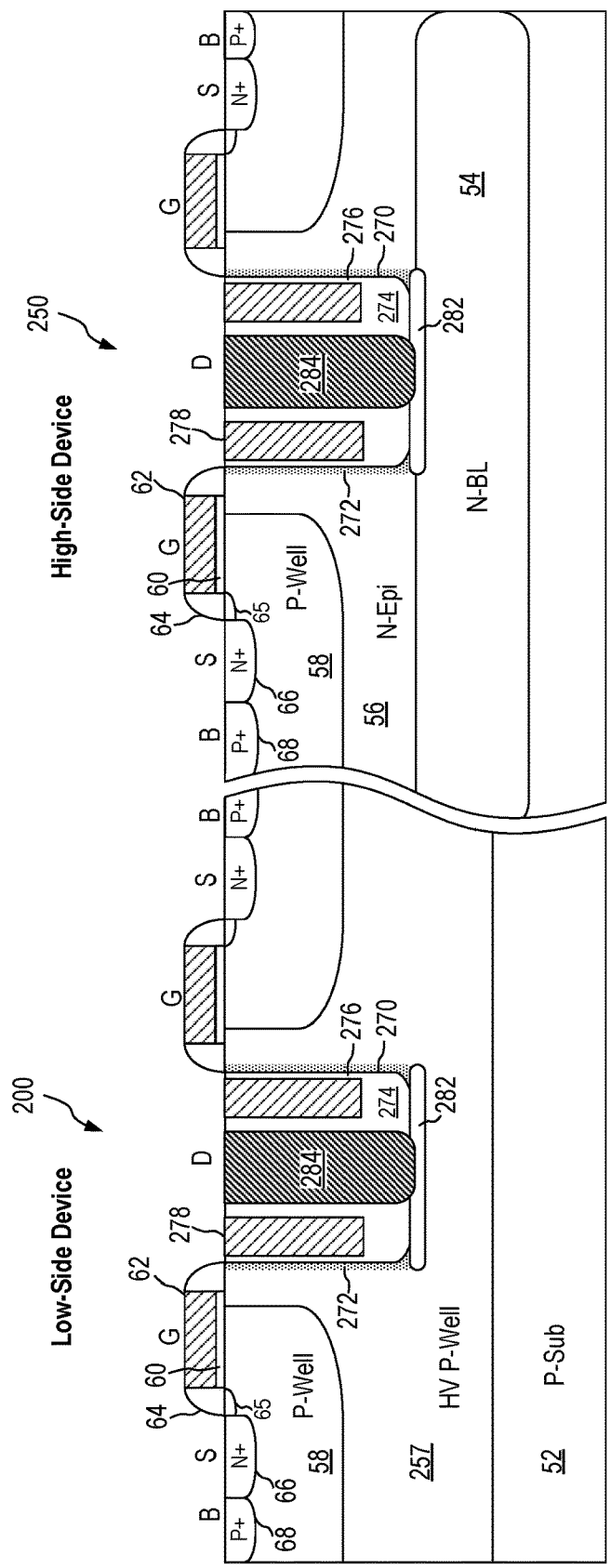
FIG. 6 is a cross-sectional view of an integrated circuit incorporating a qVDMOS transistor without buried layer and a qVDMOS transistor with buried layer according to one embodiment of the present invention.

FIG. 6 is a cross-sectional view of an integrated circuit incorporating a qVDMOS transistor without buried layer and a qVDMOS transistor with buried layer according to one embodiment of the present invention. Referring to FIG. 6, an integrated circuit includes a qVDMOS transistor 200 formed without a buried layer and a qVDMOS transistor 250 formed on a buried layer. The integrated circuit is formed on a P-type substrate 52 and an epitaxial layer 56. The qVDMOS transistor 200 is formed in a P-well 257 formed in the epitaxial layer. The P-well 257 can be a high voltage P-well, being more lightly doped and deeper than a standard P-well.

The qVDMOS transistor 200 is formed in substantially the same manner as described above with an N-type lightly doped sidewall region 272 formed along the sidewall of a trench 270 function as a vertical drain current path. In the absence of an N-buried layer, the trench 270 also serves as a trench drain electrode to receive the drain current from the lightly doped sidewall region 272. In the present embodiment, the trench is formed with a bottom doped region 282. In embodiments of the present invention, the bottom doped region 282 is formed using a two-step implantation process to form a graded junction. The trench is then lined with a thin oxide layer 276. Then, after a bottom oxide layer 274 is deposited, a polysilicon layer 278 is deposited to form a conductive field plate. The polysilicon layer 278 can be connected to the gate electrode 62 in the same manner described above to use the polysilicon layer 278 as a field plate to reduce the resistance of the drain current path. Alternately, the polysilicon layer 278 can be connected to the source/body electrode 66/68 to minimize the gate-to-drain overlap capacitance.

To form the drain electrode in the same trench 270, a second trench etch step is performed to etch through the polysilicon layer 278. An oxide layer is deposited to insulate the polysilicon layer. Then, another trench etch step is performed to form a trench opening through the bottom oxide layer 274 to the bottom doped region 282. The trench opening is filled with a conductive layer, such as aluminum or tungsten, to form a trench drain electrode 284. In this manner, drain current flows along the vertical drain current path of the lightly doped sidewall region 272 to the bottom doped region 282 and is then picked up by the trench drain electrode 284.

The qVDMOS transistor 200 can be mirrored to form an array of parallelly connected qVDMOS transistors without an N-type buried layer, with each pair of transistor structure sharing a trench structure 270.

The qVDMOS transistor 250 is formed on the P-substrate 52 with a layer of N-type buried layer 54 formed thereon. The qVDMOS transistor 200 is formed in the epitaxial layer 56 in substantially the same manner as described above with a lightly doped sidewall region 272 formed along the sidewall of a trench 270 function as a vertical drain current path. The vertical drain current path connects into the N-buried layer 54 which may be a sea of N-buried layer connecting to an array of qVDMOS transistors. The trench 270 also serves as a trench drain electrode to receive the drain current from the lightly doped sidewall region 272, which travels to the N-buried layer 54 to the bottom doped region 282 to the trench drain electrode 284.

The qVDMOS transistor 250 can be mirrored to form an array of parallelly connected qVDMOS transistors on the N-type buried layer, with each pair of transistor structure sharing a trench structure 270.

As thus constructed, the qVDMOS transistor 200 can be used as the low side transistor of a buck converter while the qVDMOS 250 can be used as the high side transistor of the buck converter. An integrated circuit can be formed with both the low side transistor and the high side transistor integrated onto the same substrate using the quasi vertical DMOS transistor structure in accordance with embodiments of the present invention. More importantly, the low side transistor is formed without an N-buried layer. Therefore, the junction capacitance between the drain node and the P-substrate is lowered. Lowering the junction capacitance between the drain node and the P-substrate is particularly important for the low side switching device as the drain of the low side switching device swings from ground and the input voltage $V_{IN}$. It is undesirable to have the N-buried layer swings from the two voltage extremes.

In the above-described embodiments, the qVDMOS transistors are formed on a P-type substrate 52 with an N-type epitaxial layer 56. When an N-type buried layer is used, the qVDMOS device 250 is formed in the N-Epitaxial layer 56 with the body formed in the P-well 58. When a buried layer is not used, the qVDMOS device 200 is formed in a high voltage P-well 257, with the body formed in the low voltage P-well 58, where the high voltage P-well is more lightly doped and deeper than low voltage P-well. In embodiments of the present invention, the qVDMOS transistors are formed on a P-type substrate 52 with P-type epitaxial layer. In that case, the lightly doped sidewall region 272 forms the N-type drain extension region for the drain current.

NMOS Transistor with Drain Extension

In the DMOS transistor structures described above, the P-well forming the body region is aligned to the active diffusion regions, that is, the source diffusion. The gate electrode is also aligned to the active diffusion regions. As a result, the P-well and the gate electrode are not self-aligned to each other but rather have separate alignment steps. There can be separate misalignment errors when both layers are aligned to the active diffusion regions. When an array of DMOS transistors are formed by mirroring the transistor structure about the trench as described above, the misalignment errors can cause the On-resistance $R_{dsON}$ to be larger for transistors on one side of the trench and smaller for transistors on the other side of the trench. Such asymmetry in On-resistance is undesirable.

According to another aspect of the present invention, an NMOS transistor is formed with a drain extension in a vertical drain current path along the sidewall of a trench. More importantly, the NMOS transistor can be formed symmetrically about the trench to avoid any misalignment errors that may cause device mismatches in mirrored devices. The drain extension has the effect of lowering the drain voltage at the edge of the gate electrode so that the channel length of the NMOS transistor can be shortened without compromising device reliability.

Figure 7:
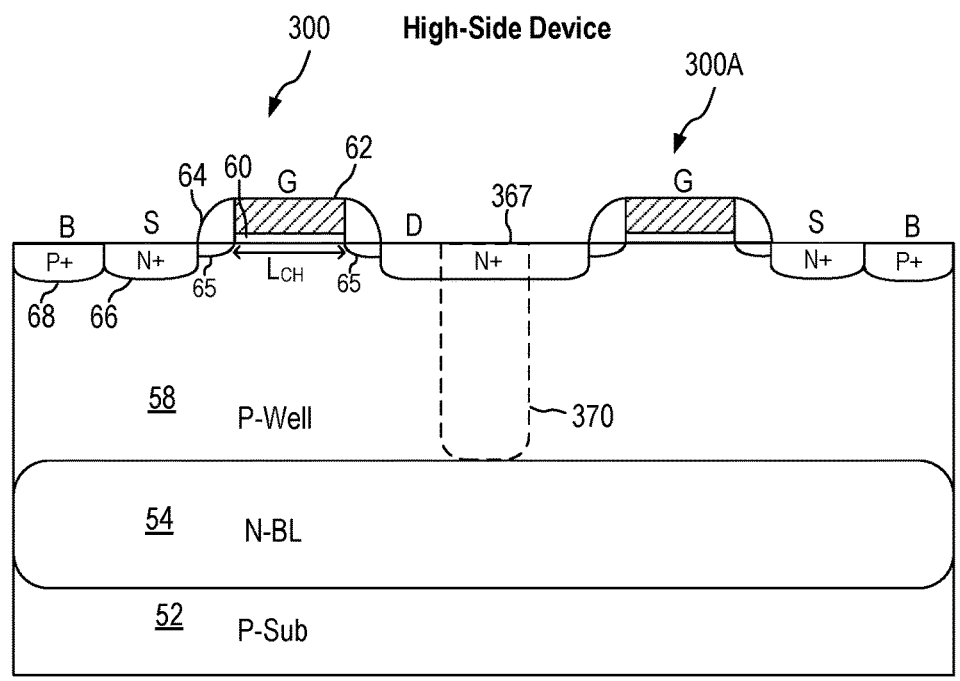
FIG. 7 is a cross-sectional view of an NMOS transistor with drain extension in an intermediate processing step according to one embodiment of the present invention.
Figure 8:
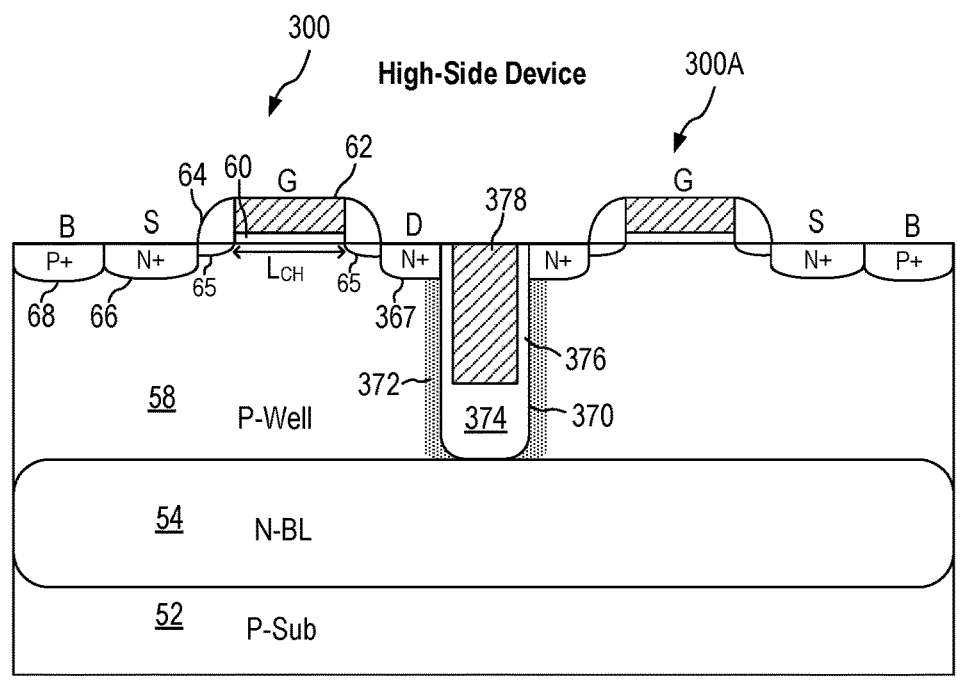
FIG. 8 is a cross-sectional view of an NMOS transistor with drain extension according to one embodiment of the present invention.

FIG. 7 is a cross-sectional view of an NMOS transistor with drain extension in an intermediate processing step according to one embodiment of the present invention. FIG. 8 is a cross-sectional view of an NMOS transistor with drain extension according to one embodiment of the present invention. Referring to FIG. 7, NMOS transistors 300 and 300A are formed on a P-type substrate 52 with an N-type buried layer 54 formed thereon. An epitaxial layer is formed on the substrate 52 which can be N-type or P-type. The NMOS transistors 300 and 300A are formed in a P-well 58 which can be formed as a sea of P-well in the epitaxial layer. NMOS transistors 300 and 300A are traditional NMOS transistors with a gate electrode 62 formed over a gate oxide layer 60. Light-doped drain diffusion regions 65 are formed before spacers 64 are formed along the sidewall of the gate electrode 62. Then N+ source diffusion region 66 and drain diffusion region 367 are formed as well as the P+ body contact diffusion region 68. A lateral channel is formed under the gate electrode and the gate oxide layer having a channel length denoted by "$L_{CH}$".

In the present embodiment, NMOS transistors 300 and 300A are to be formed as an array of parallelly connected NMOS transistors. The drain diffusion region 367 is formed as an elongated diffusion region connecting two adjoining NMOS transistors. In embodiments of the present invention, a trench 370 is to be formed in the drain diffusion region 367, as noted by the dotted line in FIG. 7. The trench 370 is positioned such that portions of the drain diffusion region 367 are left on either side of the trench.

Referring now to FIG. 8, the trench 370 is formed in the drain diffusion region 367 and the P-well 58 and reaches the N-buried layer 54. N-type sidewall implantation is performed to form lightly doped sidewall region 372 along the sidewall of the trench. A thin sidewall oxide layer 376 is formed lining the sidewall of the trench 370 and then a thick oxide layer 374 is deposited into the bottom of the trench. The trench is then filled with a conductive layer, such as a polysilicon layer 378, to form a conductive field plate. The conductive field plate 378 can be electrically connected to the gate electrode or to the source electrode. The conductive field plate 378 operates in the same manner as described above with reference to FIG. 3 where the conductive field plate can be biased to be in accumulation mode to reduce the On-resistance of the vertical drain current path or biased to reduce the gate-to-drain overlap capacitance.

As thus constructed, the NMOS transistors 300 and 300A have a traditional lateral channel under the gate electrode 62 bounded by the source and drain diffusion regions and the transistors have a drain terminal in the drain diffusion region 367. The drain current received at the drain terminal is directed to the vertical drain current path formed in the lightly doped sidewall region 372. In the present embodiment, the drain current is collected by the N-buried layer 54 and a drain pick-up electrode, such as a trench drain electrode, may be provided elsewhere in the integrated circuit to connect to the N-buried layer 54, in the same manner as shown in FIG. 3.

The NMOS transistors thus formed have many advantages. First, by having a drain diffusion region at both side of the trench, the channel of the transistor becomes symmetrical and the device characteristics are not affected by misalignment errors. Furthermore, because the drain diffusion region is highly doped, the drain diffusion region is low resistivity. Therefore, the absolute positioning of the trench 370 within the drain diffusion region is not critical. The drain diffusion region remaining on either side of the trench 370 can be longer or shorter without affecting the transistor device characteristics.

An important feature of the NMOS transistor with drain extension is that the drain diffusion region at the edge of the gate electrode will not see high voltages as long as the lightly doped sidewall region has sufficiently high resistivity. Thus, the channel length $L_{CH}$ of the transistor, or the drain to source/body pitch of the transistor, can be reduced to form smaller devices without sacrificing device reliability. In fact, with the drain extension, the NMOS transistor will see at most a few volts at the drain diffusion region. Punch-through or hot carrier injection issues are obviated.

Figure 9:
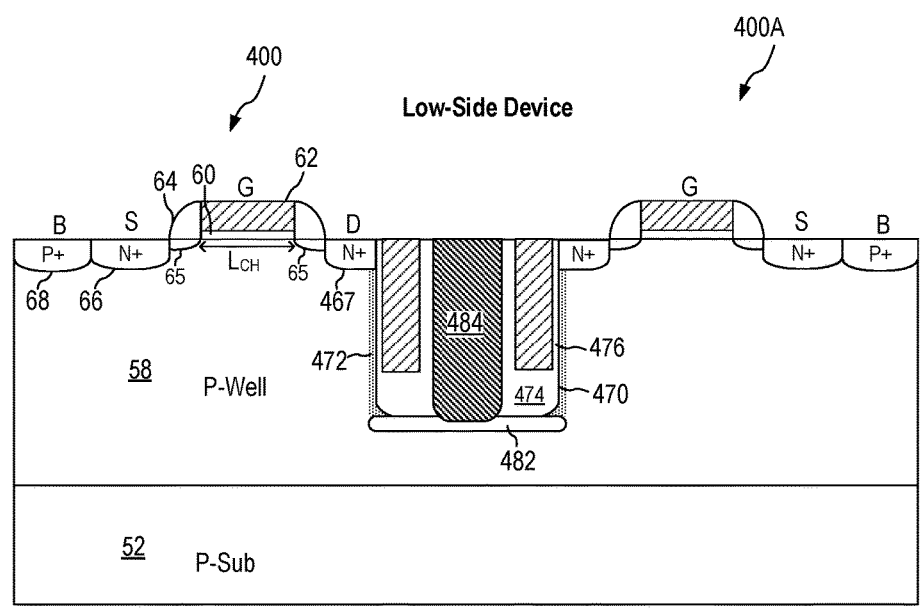
FIG. 9 is a cross-sectional view of an NMOS transistor with drain extension according to an alternate embodiment of the present invention.

In alternate embodiments of the present invention, the NMOS transistor with drain extension described above can be formed without a buried layer. FIG. 9 is a cross-sectional view of an NMOS transistor with drain extension according to an alternate embodiment of the present invention. Referring to FIG. 9, the NMOS transistors 400 and 400A are formed in substantially the same manner as transistors 300/300A except that no N-type buried layer is provided on P-substrate 52. In that case, a trench drain electrode is formed in the trench 470 to make electrical contact with the vertical drain current path formed in the lightly doped sidewall region 472. The trench structure including a conductive field plate 476 and a trench drain electrode 484 is formed in the same manner above as described with reference to FIG. 6. As thus constructed, the drain current from the channel flows through the drain diffusion region 467 and down the vertical drain current path in the lightly doped sidewall region 472, through the trench bottom diffusion region 482 and the drain current is picked up by the drain electrode 484.

The transistors 300/300A of FIG. 8 and transistors 400/400A of FIG. 9 can be formed on the same integrated circuit to use as the power switching devices for a buck converter. The NMOS transistors 300/300A with the buried layer can be used as the high side switching device while the NMOS transistors 400/400A without the buried layer can be used as the low side switching device.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A transistor, comprising:
   a semiconductor body of a first conductivity type;
   a first gate electrode formed on a first portion of the semiconductor body and insulated from the semiconductor body by a gate dielectric layer, a drain region of a second conductivity type formed on a first side of the first gate electrode and a first source region of the second conductivity type formed on a second side of the first gate electrode, the second side opposite the first side;
   a second gate electrode formed on a second portion of the semiconductor body and insulated from the semiconductor body by the gate dielectric layer, the drain region being formed on a first side of the second gate electrode and a second source region of the second conductivity type formed on a second side of the second gate electrode;
   a trench formed in the semiconductor body and positioned in the drain region, the trench being lined with a thin dielectric layer as a sidewall dielectric layer, the trench being filled with a bottom dielectric layer at a lower portion of the trench and a conductive layer above the bottom dielectric layer, the conductive layer being electrically connected to the gate electrode, wherein the first and second portions of the semiconductor body are on opposite sides of the trench; and a doped sidewall region of the second conductivity type formed in the semiconductor body along the sidewall of the trench outside of the trench, the doped sidewall region being in electrical contact with the drain region and forming a vertical drain current path for the transistor, the drain current of the transistor flowing in the doped sidewall region in the semiconductor body outside of the trench.

2. The transistor of claim 1, wherein the conductive layer formed in the trench is electrically connected to the first and second gate electrodes to form a trench conductive field plate for the vertical drain current path, the field plate being biased to an accumulation mode when the transistor is turned on to reduce the resistivity of the vertical drain current path.

3. The transistor of claim 1, wherein the thin dielectric layer comprises a thin oxide layer and the conductive layer in the trench comprises a polysilicon layer.

4. The transistor of claim 1, wherein the trench is positioned in the drain region and the drain region has a first length between the trench and first gate electrode and a second length between the trench and the second gate electrode, the first length does not equal the second length.

5. The transistor of claim 1, wherein the trench is positioned in the drain region and the drain region has a first length between the trench and first gate electrode and a second length between the trench and the second gate electrode, the first length being the same as the second length.

6. The transistor of claim 1, wherein the semiconductor body comprises:
a substrate of the first conductivity type;
a buried layer of the second conductivity type formed on the substrate; and
an epitaxial layer formed on the substrate and a well region of the first conductivity type formed in the epitaxial layer,
wherein the first and second portions of the semiconductor body and the trench are formed in the well region and the trench reaches at least the buried layer and the drain current of the transistor flows through the doped sidewall region to the buried layer.

7. The transistor of claim 6, further comprising:
a second trench formed in the semiconductor body remote from the trench and reaching at least the buried layer, the second trench being lined with a second sidewall dielectric layer and filled with a second conductive layer; and
a trench bottom doped region of the second conductivity type being formed in the semiconductor body beneath the second trench,
wherein the second conductive layer of the second trench is in electrical contact with the trench bottom doped region and the buried layer, the second conductive layer forming a trench drain electrode conducting the drain current of the transistor.

8. The transistor of claim 7, wherein the second conductive layer comprises one of aluminum or tungsten.

9. The transistor of claim 1, wherein the transistor comprises a double-diffused MOS transistor with a lateral channel under the first and second gate electrodes and the drain current flows from the drain region to the vertical drain current path in the doped sidewall region along the sidewall of the trench.

10. The transistor of claim 1, wherein the drain region is more heavily doped than the doped sidewall region.

11. The transistor of claim 1, wherein the first conductivity type comprises P-type conductivity and the second conductivity type comprises N-type conductivity.

12. A transistor, comprising:
a semiconductor body of a first conductivity type;
a first gate electrode formed on a first portion of the semiconductor body and insulated from the semiconductor body by a gate dielectric layer, a drain region of a second conductivity type formed on a first side of the first gate electrode and a first source region of the second conductivity type formed on a second side of the first gate electrode, the second side opposite the first side;
a second gate electrode formed on a second portion of the semiconductor body and insulated from the semiconductor body by the gate dielectric layer, the drain region being formed on a first side of the second gate electrode and a second source region of the second conductivity type formed on a second side of the second gate electrode;
a trench formed in the semiconductor body and positioned in the drain region, the trench being lined with a thin dielectric layer as a sidewall dielectric layer;
a doped sidewall region of the second conductivity type formed in the semiconductor body along the sidewall of the trench outside of the trench, the doped sidewall region being in electrical contact with the drain region and forming a vertical drain current path for the transistor, the drain current of the transistor flowing in the doped sidewall region in the semiconductor body outside of the trench;
a trench bottom doped region of the second conductivity type formed in the semiconductor body beneath the trench and in electrical contact with the doped sidewall region formed in the semiconductor body along the sidewall of the trench,
wherein the trench is filled at an outer perimeter with a bottom dielectric layer at a lower portion of the trench and a first conductive layer above the bottom dielectric layer, and the remaining portion of the trench is filled with a second conductive layer in electrical contact with the trench bottom doped region, the second conductive layer being electrically insulated from the first conductive layer by a dielectric layer, the second conductive layer forming a trench drain electrode, the drain current of the transistor flowing in the vertical drain current path is directed to the trench bottom doped region and to the trench drain electrode.

13. The transistor of claim 12, wherein the first conductive layer formed in the trench is electrically connected to the first and second gate electrodes or to the first and second source regions.

14. The transistor of claim 12, wherein the first conductive layer formed in the trench is electrically connected to the first and second gate electrodes to form a trench conductive field plate for the vertical drain current path, the field plate being biased to an accumulation mode when the transistor is turned on to reduce the resistivity of the vertical drain current path.

15. The transistor of claim 12, wherein the thin dielectric layer comprises a thin oxide layer, the first conductive layer comprises a polysilicon layer and the second conductive layer comprises one of aluminum or tungsten.

16. The transistor of claim 12, wherein the trench is positioned in the drain region and the drain region has a first length between the trench and first gate electrode and a second length between the trench and the second gate electrode, the first length does not equal the second length.

17. The transistor of claim 12, wherein the trench is positioned in the drain region and the drain region has a first length between the trench and first gate electrode and a second length between the trench and the second gate electrode, the first length being the same as the second length.

18. The transistor of claim 12, wherein the semiconductor body comprises:
   a substrate of the first conductivity type; and
   an epitaxial layer formed on the substrate and a well region of the first conductivity type formed in the epitaxial layer,
   wherein the first and second portions of the semiconductor body and the trench are formed in the well region.

19. The transistor of claim 12, wherein the transistor comprises a double-diffused MOS transistor with a lateral channel under the gate electrode and a vertical drain current path in the doped sidewall region along the sidewall of the trench.

20. The transistor of claim 12, wherein the drain region is more heavily doped than the doped sidewall region.

* * * * *